United States Patent
Blamey et al.

(10) Patent No.: US 6,731,767 B1
(45) Date of Patent: May 4, 2004

(54) ADAPTIVE DYNAMIC RANGE OF OPTIMIZATION SOUND PROCESSOR

(75) Inventors: Peter John Blamey, Mount Waverley (AU); Christopher John James, Armadale (AU); Konrad Wildi, Rupperswil (CH); Hugh Joseph McDermott, Carlton (AU); Lois Martin, Hawthorn (AU)

(73) Assignee: The University of Melbourne, Parkville (AU)

( * ) Notice: Subject to any disclaimer, the term of this patent is extended or adjusted under 35 U.S.C. 154(b) by 0 days.

(21) Appl. No.: 09/478,022

(22) Filed: Jan. 5, 2000

(30) Foreign Application Priority Data

Feb. 5, 1999 (WO) ............... PCT/AU99/00076

(51) Int. Cl.[7] .............................................. H04R 25/00
(52) U.S. Cl. .................. 381/312; 381/316; 381/320; 381/321
(58) Field of Search .................. 381/316, 317, 381/318, 320, 321, 312, 94.2, 94.3, 57

(56) References Cited

U.S. PATENT DOCUMENTS

| 4,596,902 A | | 6/1986 | Gilman |
|---|---|---|---|
| 4,833,717 A | | 5/1989 | Nakamura et al. |
| 4,852,175 A | * | 7/1989 | Kates ........................ 381/317 |
| 4,856,522 A | | 8/1989 | Hansen |
| 5,027,410 A | | 6/1991 | Williamson et al. |
| 5,661,699 A | | 8/1997 | Sutton |
| 5,687,241 A | | 11/1997 | Ludvigsen |
| 5,724,433 A | * | 3/1998 | Engebretson et al. ........ 381/106 |
| 5,794,187 A | | 8/1998 | Franklin et al. |
| 6,094,489 A | * | 7/2000 | Ishige et al. .................. 381/60 |

FOREIGN PATENT DOCUMENTS

| EP | 2 091 065 A | 7/1982 |
|---|---|---|
| EP | 0 077 688 A1 | 4/1983 |
| EP | 0 250 679 A2 | 1/1988 |
| EP | 0 326 905 A1 | 8/1989 |
| EP | 0 337 868 A2 | 10/1989 |
| WO | WO 85/02085 A1 | 5/1985 |
| WO | WO 96/35314 A1 | 11/1996 |
| WO | WO 98/27787 A1 | 6/1998 |

* cited by examiner

Primary Examiner—Curtis Kuntz
Assistant Examiner—Tuân D Nguyén
(74) Attorney, Agent, or Firm—Gottlieb, Rackman & Reisman, P.C.

(57) ABSTRACT

In one embodiment an apparatus for processing sound includes a means (401) for analyzing a sound signal into a number frequency bands and a means (403) for applying variable gain to each frequency band independently. Gain is applied under control of a number of gain comparator means (409) each of which generates a number of statistical estimates in respect of each signal and compares those estimates to predetermined hearing response parameters stored in memory (411). The numerous gain compensated frequency bands are then combined (415) in order to generate a single sound signal. The apparatus may be implemented in dedicated hardware embodiment or by software running on a microprocessor.

21 Claims, 9 Drawing Sheets

ADAPTIVE DYNAMIC RANGE OF OPTIMIZATION SOUND PROCESSOR

FIELD OF THE INVENTION

The present invention relates to the field of devices and methods for processing sound and in particular to a processor for improving the speech perception and comfort of a hearing impaired user. However, while the invention is suited for use with hearing impaired people it will also find application in other communication areas.

BACKGROUND

In general the effects of hearing impairment are characterised by the undesirable conditioning of a sound signal, for example spoken words, along a listener's hearing chain so as to result in attenuation and often distortion of the signal.

Relatively simple linear gain hearing aids, for example fixed gain aids, have been successful in amplifying sounds to make them audible and recognisable. One problem with fixed gain aids however is that they are usually not suitable for use over a wide range of sound frequencies and levels. For example, when using a fixed gain aid the listener often finds that some sounds are inaudible, that is below hearing threshold, while others are at, or above, the loudness discomfort level, (LDL). Such a problem is especially prevalent when the listener is a person with a narrow dynamic range between the threshold and LDL levels.

Multi-band compression schemes attempt to overcome the problems of narrow dynamic range by adapting the gain of the aid in response to changes in the input sound level within a number of frequency bands, that is, they make use of a non-linear compression scheme. However, non-linear compression schemes introduce distortions into the output signals which reduce speech intelligibility. Hearing aids incorporating multi-band compression schemes are also difficult to fit and may require a lengthy investigation of the subject's hearing response.

One type of multi-channel hearing aid is the subject of U.S. Pat. No. 5,687,241 to Ludvigsen. In that document there is described a multi-channel hearing aid which splits an input signal into a number of parallel, filtered channels. The filtered input signals are each monitored by a percentile estimator and on the basis of control signals generated by the percentile estimators the gain of each of the filtered signals is adjusted. The filtered, gain adjusted signals are then recombined, amplified and converted to an acoustic signal.

A problem with the aid of U.S. Pat. No. 5,687,241 is that the percentile estimators must be capable of accommodating large swings in the amplitude of the signal being monitored. Consequently in a digital implementation considerable processing power is required in order to undertake the percentile estimation calculations.

A further problem that arises during the operation of multi-channel hearing aids is that fast transient signals having magnitudes exceeding the maximum comfort level may arise. Typically such transients occur in only a small number of channels at a particular time however in order to prevent discomfort to the user of the aid the general prior art approach has been to reduce the total power output of the aid. While such an approach prevents discomfort it causes undesirable distortion of the signal in channels unaffected by fast transient signals.

Single channel automatic gain control (AGC) hearing aids operate to reduce the gain at all frequencies in the event that the level of a sound should reach a predetermined point. While such hearing aids prevent the sound from reaching the subject's LDL they also attenuate some frequency components of the speech signal to such an extent that the intelligibility of the speech is reduced.

In summary, prior art hearing aids have associated with their use a variety of problems. Such problems range from inappropriate compression of signal, which causes undue signal distortion, to onerous processing requirements which make the aids expensive and difficult to implement.

In light of the prior art it is an object of the present invention to provide an apparatus which, in the presence of an ambient sound signal, generates a transformed sound signal which conforms to predetermined amplitude requirements within a range of audible frequencies.

It is a further object of the invention to provide a means whereby fast transient signals may be suppressed, in order to prevent discomfort to the user of a multi-channel hearing aid, without introducing signal distortion into channels unaffected by said transient signals.

SUMMARY OF THE INVENTION

According to a first aspect of the present invention there is provided a method for processing an ambient sound signal including the steps of a) generating an input spectrum comprising a plurality of frequency components corresponding to said signal;

b) multiplying each of said frequency components by a corresponding one of a plurality of gain values to produce a plurality of adjusted frequency components;

c) determining distribution values characteristic of the amplitude distribution of each of the plurality of adjusted frequency components over a period of time;

d) setting said gain values on the basis of comparisons between said distribution values and a plurality of hearing response parameters.

According to a further aspect of the present invention there is provided an apparatus for processing an ambient sound signal including:

a) a frequency analysis means arranged to generate an input spectrum comprising a plurality of frequency components corresponding to said ambient signal;

b) a magnitude adjustment means coupled to the frequency analysis means and arranged to adjust the magnitude of each of said frequency components to produce an output spectrum comprising a plurality of adjusted frequency components corresponding to an adjusted sound signal related to the ambient sound signal;

c) a distribution estimation means responsive to said plurality of adjusted frequency components and arranged to generate distribution values characteristic of the amplitude distribution of each of the said plurality of adjusted frequency components over period of time; and d) a comparison means coupled to the distribution estimation means and arranged to perform comparisons of said distribution values with hearing response parameters, said comparison means controlling said magnitude adjustment means on the basis of said comparisons.

Preferably, the frequency analysis means, the magnitude adjustment means, the distribution estimation means and the comparison means are implemented by a programmed microprocessor coupled to memory storage means.

Preferably, the apparatus further includes a signal conversion means by which the output spectrum is converted to a sound signal for presentation to a human listener.

Alternatively the output spectrum might be further processed by a further signal processor, such as for example, a cochlear prosthesis.

Preferably, the parameters characteristic of the hearing response include maximum comfortable level, threshold level, and optimum audibility level for each of the plurality of frequency components.

It will be realised by the skilled addressee that, because the magnitude adjustment means of the present invention is controlled by a comparison means which performs a comparison on the output spectrum, rather than the input spectrum, the above apparatus operates to ensure that the adjusted sound signal conforms to predetermined amplitude requirements across a range of audible frequencies, thereby achieving at least the object of the invention.

Preferably, the frequency analysis means, the magnitude adjustment means, the distribution estimation means, and the comparison means, referred to above are implemented by a programmed microprocessor. Nevertheless it will be realised that other implementations are possible, for example the invention could be implemented using dedicated hardware rather than a microprocessor, or even in a substantially analog form, the construction of such implementations will be apparent to those skilled in the art in light of the following description of a preferred embodiment.

According to a final aspect of the invention there is provided a multi-channel hearing aid having a plurality of channels, said hearing aid including a plurality of hard limiters each coupled to a corresponding one of said plurality of channels, each said limiter arranged to prevent signals in said corresponding channel exceeding a corresponding predetermined level.

Preferably each of said limiters are arranged to act without appreciable delay, for example within 0.1 millisecond.

By providing a means for limiting fast transients in each channel of a multi-channel hearing aid discomfort associated with said transients is avoided without introducing distortion into the channels unaffected by the transients.

DESCRIPTION OF THE PREFERRED EMBODIMENTS

Figure 1:
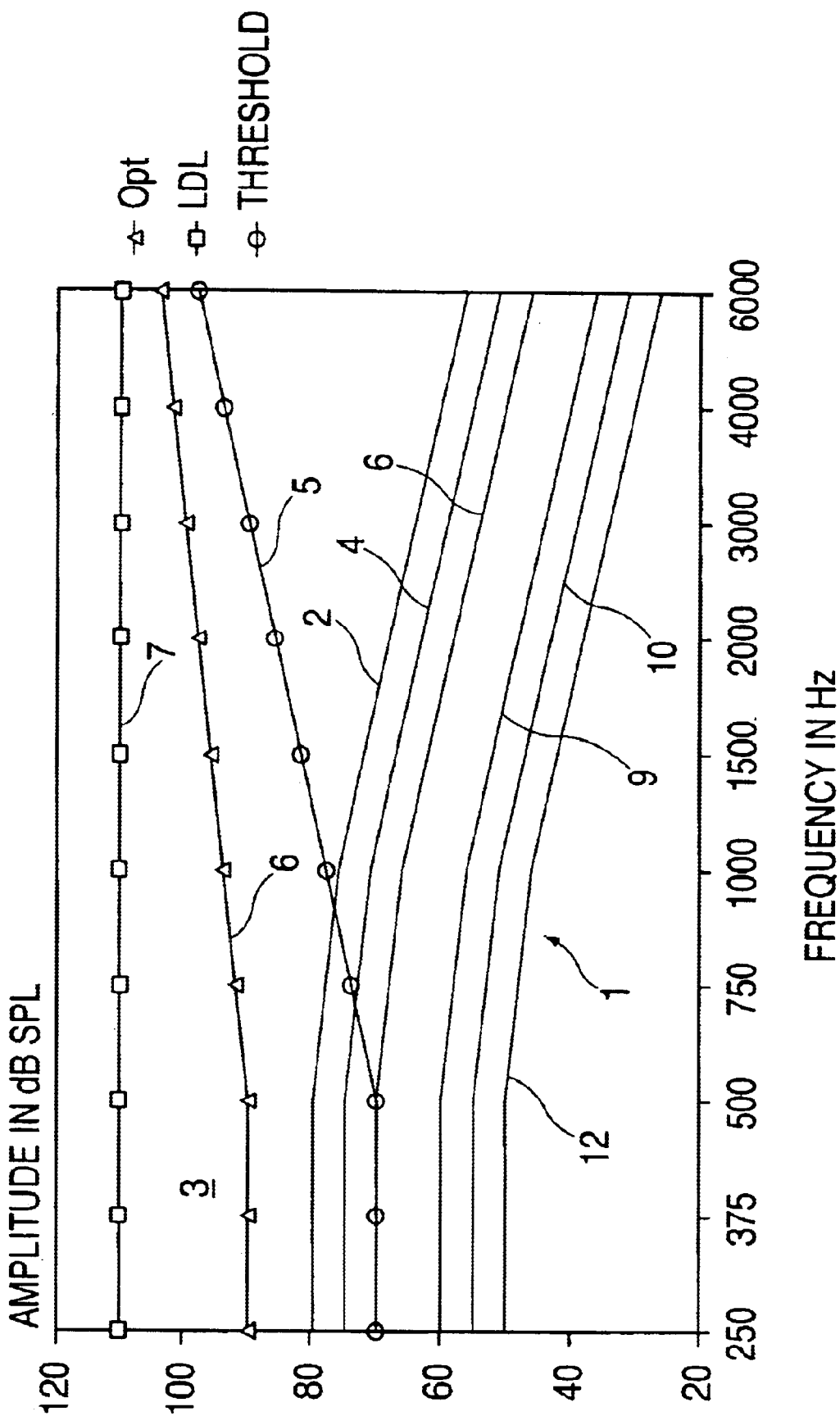
FIG. 1 is an amplitude vs frequency graph including hypothetical threshold and loudness discomfort level lines for an unaided, severely hearing impaired, listener. The shaded regions indicate a hypothetical distribution of amplitudes for a speech signal in low background noise.

Referring now to FIG. 1 there is shown a graph with horizontal axis being Frequency in Hz and vertical axis being amplitude in dB of sound pressure level (SPL). Plotted on the graph is a speech signal region 1 which represents the amplitude and frequency distribution of the speech of a single speaker in a quiet room. Region 1 is demarcated into 5 sub-regions bounded by lines 2, 4, 8, 9, 10 and 12. The sub-region between lines 2 and 4 represents the 90–100th percentile distribution of the single speaker speech signal across the 250 Hz–6000 Hz frequency range. Similarly lines 4 and 8 bound the 70th–90th percentile, lines 8 and 9 the 30th–70th percentile, lines 9 and 10 the 10th–30th percentile and lines 10 and 12 the 0th–10th percentile. For further information regarding such graphs, reference can be made to a paper by HK Dunn and SD White, entitled "Statistical Measurements on Conversational Speech", Journal of the Acoustical Society of America, 11:278–288, 1940. The paper includes measured amplitude distributions for male and female speakers in quiet.

Also plotted on the graph of FIG. 1 is the hearing response 3 of a severely hearing impaired listener. Hearing response 3 is bounded at its lower border by threshold level 5 and at its upper border by LDL 7. Speech signal frequency components which fall between these two levels will be perceived by the hearing impaired person while those that fall below will not. In the case of FIG. 1 it will be realised that the frequency components of the speech signal in the range 1000–6000 Hz are all below the threshold of the listener. For example, at 4000 Hz the listener's threshold level is about 95 dB and the maximum speech level is about 60 dB. Also plotted on the graph of FIG. 1 is the optimum audible level 6.

Figure 2:
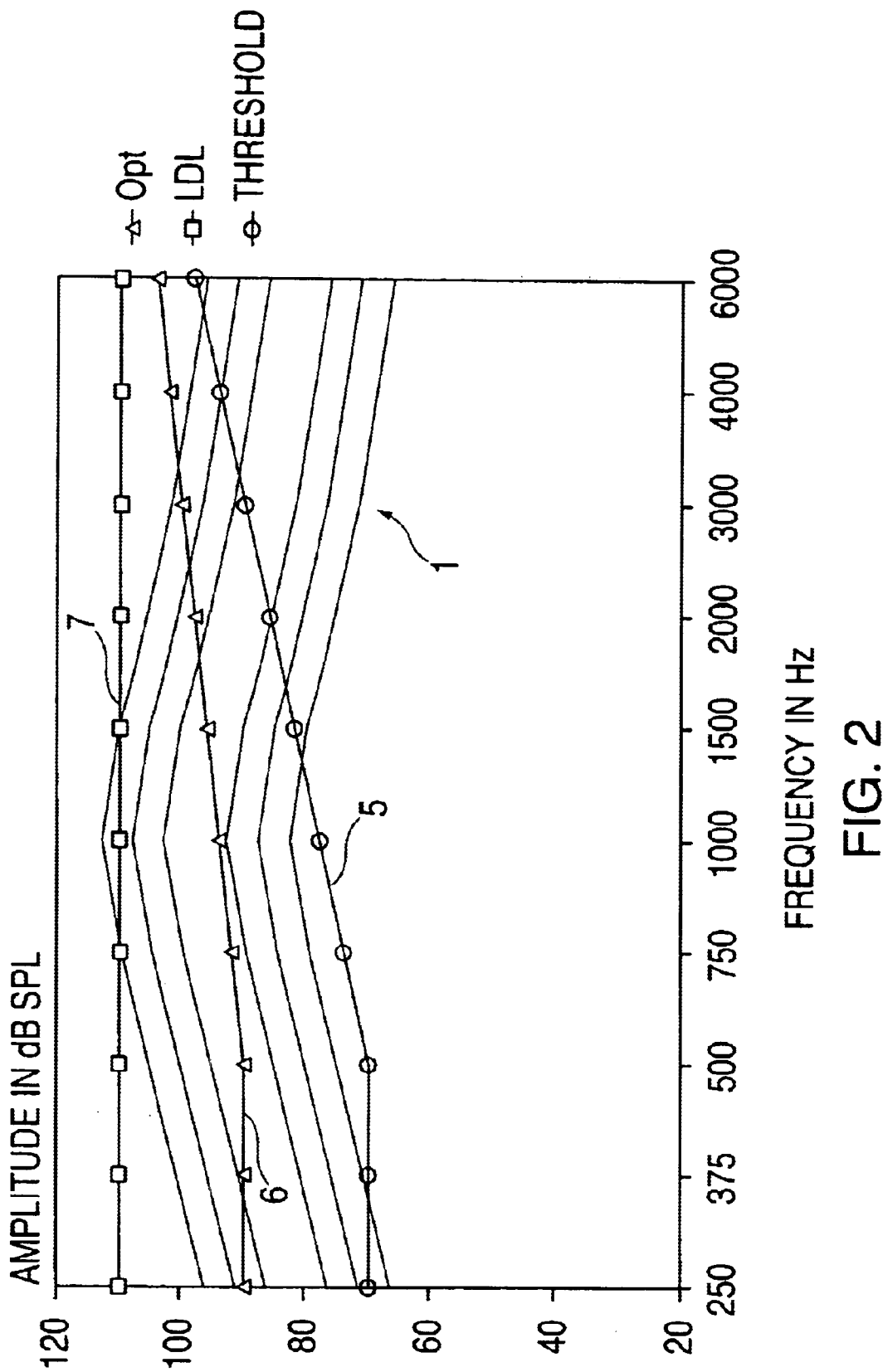
FIG. 2 is a graph similar to FIG. 1 wherein the speech signal has been amplified by a linear gain hearing aid.

Referring now to FIG. 2 there is depicted once again the frequency distribution 1 of the speech of a single speaker in a quiet room and also the hearing response of the severely hearing impaired person of FIG. 1, this time amplitude distribution is now about 100 dB. Accordingly the top 10% of the speech signal at 4000 Hz is now audible. The remaining 90% of the amplitude distribution of speech at 4000 Hz falls below the threshold level and is not heard at all. The upper part of the speech amplitude distribution at 1000 Hz lies above the LDL of 110 dB SPL and will produce an uncomfortably loud sound unless limited by an AGC which would reduce the audibility at 4000 Hz and other frequencies, or by peak clipping (a form of instantaneous nonlinear compression) which would introduce distortion across a wide range of frequencies.

Figure 3:
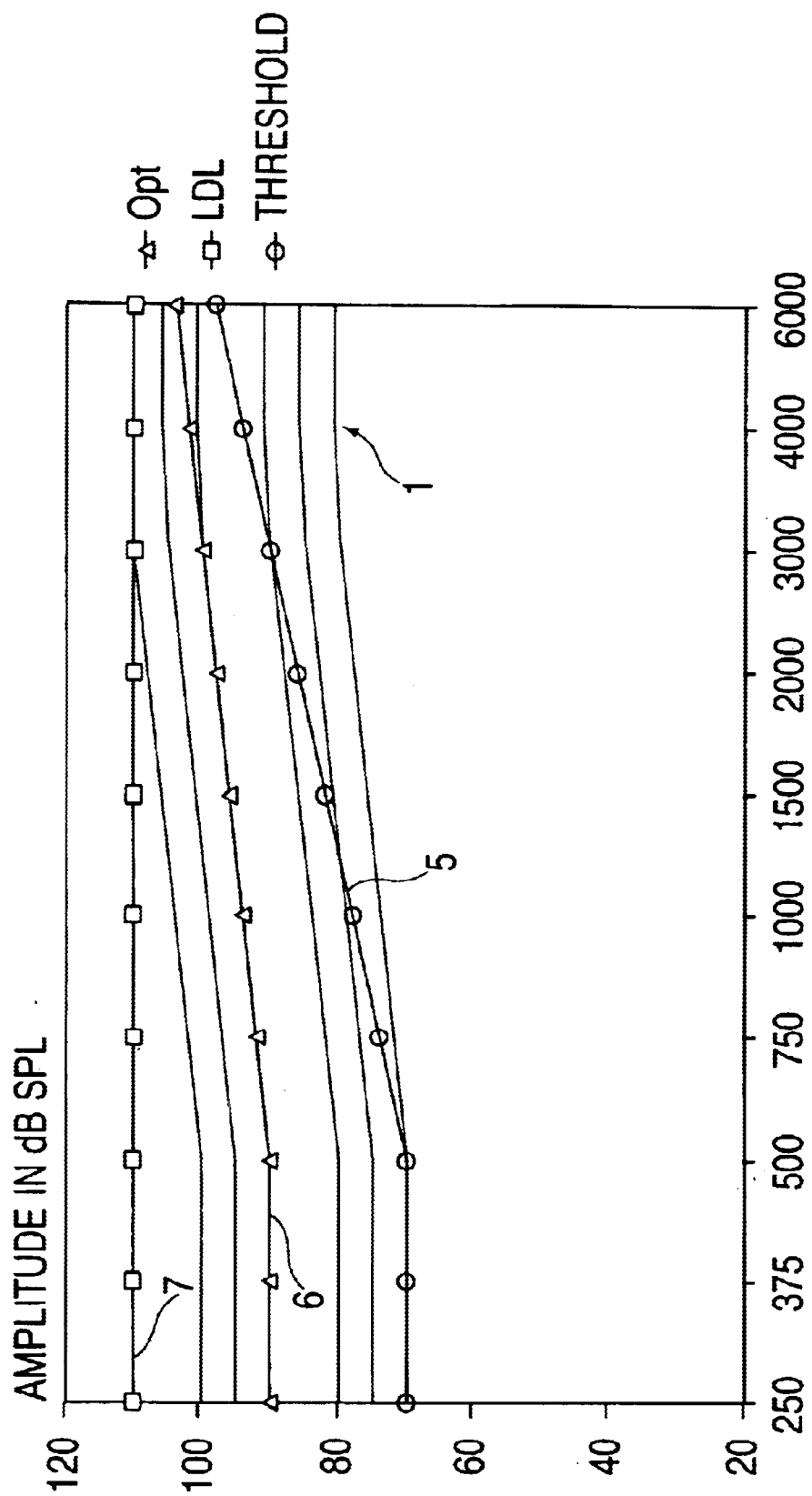
FIG. 3 is a graph similar to FIG. 1 and FIG. 2 wherein the speech signal has been processed according to the present invention.

Referring now to FIG. 3 there is depicted a third graph, this time illustrating the hearing response of the severely hearing impaired subject of FIG. 1 when wearing an adaptive dynamic range optimisation (ADRO) hearing aid according to the present invention. It will be noted that the amplitude and frequency distribution 1 of the speech signal now falls almost entirely within the boundaries of the acceptable levels which may be presented to the hearing aid user, so that all the frequency components of the speech signal are perceived by the listener. Consequently there is a marked increase in audibility, a marked reduction in distortion, of the signal perceived by the subject, and a corresponding increase in intelligibility of the words comprising the signal.

At the same time, no frequency component of the output signal exceeds the listener's LDL. The construction and operational processes of a hearing aid according to the invention will now be explained.

Figure 4:
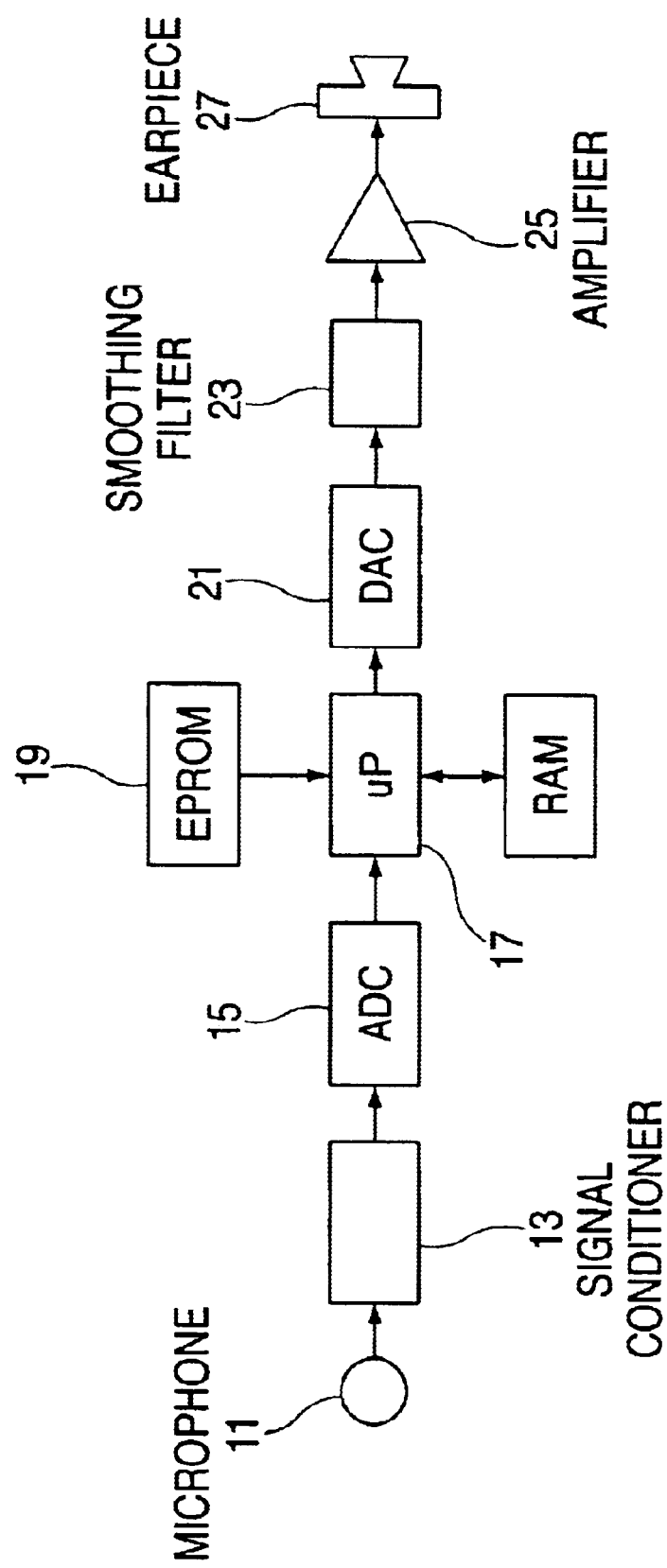
FIG. 4 schematically depicts a hearing aid constructed in accordance with the present invention.

With reference to FIG. 4 there is depicted a digital hardware implementation of the hearing aid. Sound waves are transduced by microphone 11 and, the electrical signal so produced, conditioned by analog conditioning module 13. Conditioning module 13 includes standard circuits for pre-amplifying and low pass filtering the signal prior to its processing by analog to digital converter 15. Analog to digital converter 15 produces a 16 bit digital signal which is conveyed to microprocessor 17. Microprocessor 17 operates according to a program stored in EPROM 19. The microprocessor performs a fast Fourier transform and generates an input spectrum which is processed, as will be described, to generate an output spectrum comprising a plurality of frequency components. The output spectrum is then subjected to an inverse fast Fourier transform in order to produce a digital output signal. The digital output signal is passed to a suitable digital to analog converter 21 which generates an analog signal. The analog signal is passed through smoothing filter 23 and to power amplifier 25. The amplified signal then drives earpiece 27.

Figure 4A:
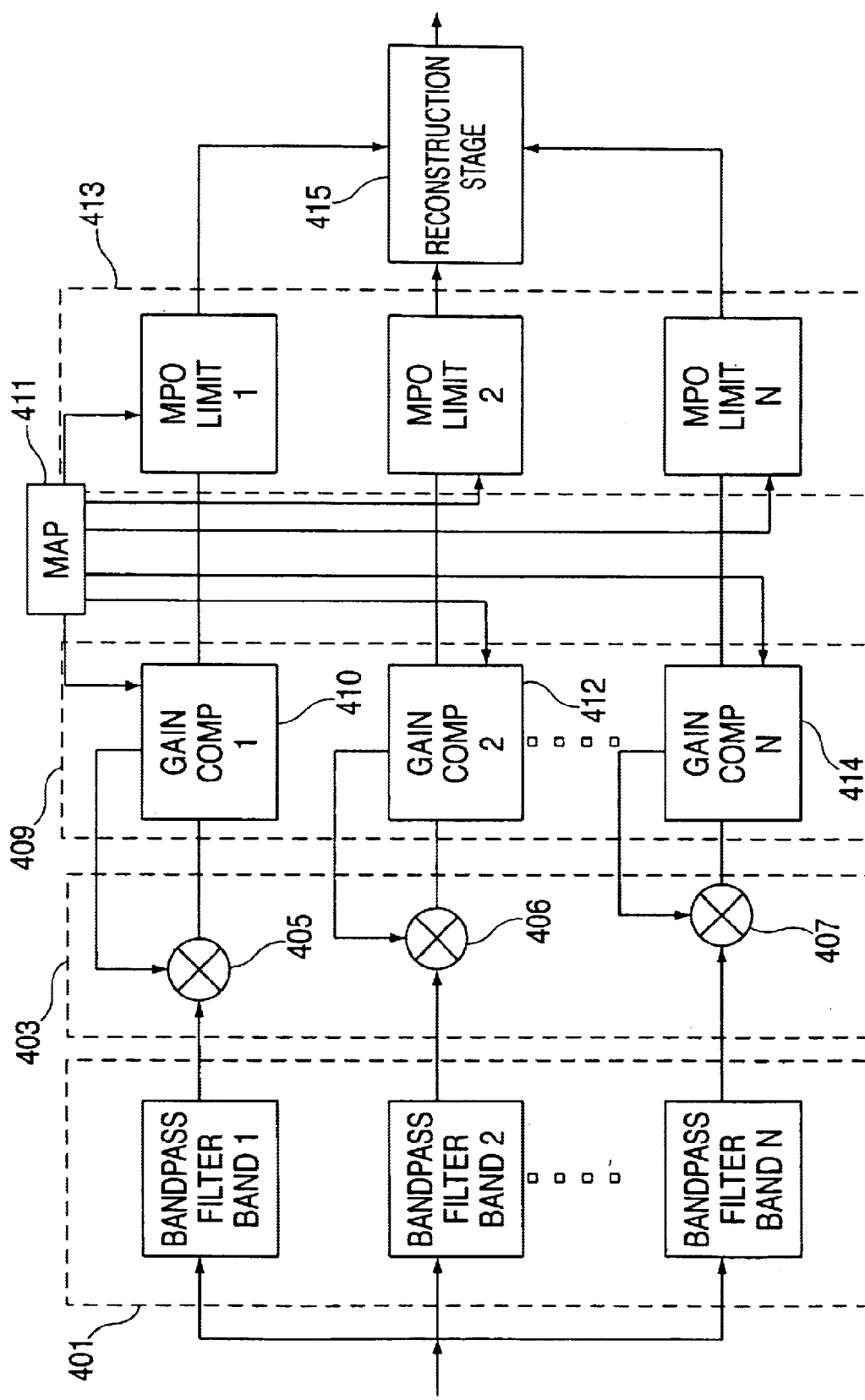
FIG. 4A schematically depicts a dedicated hardware implementation of a hearing aid constructed in accordance with the present invention.

FIG. 4a depicts a dedicated hardware implementation of the invention for purposes of explanation. While FIG. 4a illustrates the invention as if individual parts of processor 17 were embodied in dedicated hardware, the invention is most readily implemented by the arrangement of FIG. 4.

Referring to FIG. 4a, the signals from the ADC 15 are subjected to multi-channel frequency analysis and classified into n (for example n=8) frequency bands in analysis section 401. The frequency analysis depicted is carried out by means of n band-pass switched-capacitor filters. The resulting n frequency analysis signals from frequency analysis section 401 are then conveyed to magnitude adjustment section 403. The magnitude of each of the n signals is adjusted by one of n gain control elements 405–407 under the control of a gain computation section 409 comprising n gain computation elements 410, 412, 414. Each of the n gain computation elements monitors a corresponding one of the n gain adjusted signals, processes its signal in a manner that will shortly be explained with reference to FIG. 4b, and controls the amount of gain applied by gain control elements 405–407 of magnitude adjustment section 403. Map 41 comprises a, memory storing a set of previously determined hearing response parameters. The predetermined parameters are the threshold level (TL), the maximum comfortable level (MCL), maximum power output level (MPO), optimal audible level (OPT), and maximum gain level (MAXGAIN) for the intended user of the device at each of the centre frequencies of the n channels. The maximum gain level is just below the level at which feedback occurs for the channel in question during operation of the aid. The maximum gain level is determined during fitting of the aid.

The magnitude adjusted analysis signals are passed to maximum power output limiting section 413 comprised of n maximum power output iimiters which compare each of the n signals with the corresponding predetermined maximum power output level stored in map 411. The MPO limiters ensure that the signal cannot exceed the predetermined MPO value for each channel. The output limiters are designed to act within 0.1 milliseconds in order to suppress fast transients. It will be noted that the MPO limiters act independently so that a signal in a particular channel is only affected if a fast transient has occurred in that channel. The n signals then pass to reconstruction stage 415 which recombines the n magnitude adjusted signals, typically by summing the waveforms from each channel.

Figure 4B:
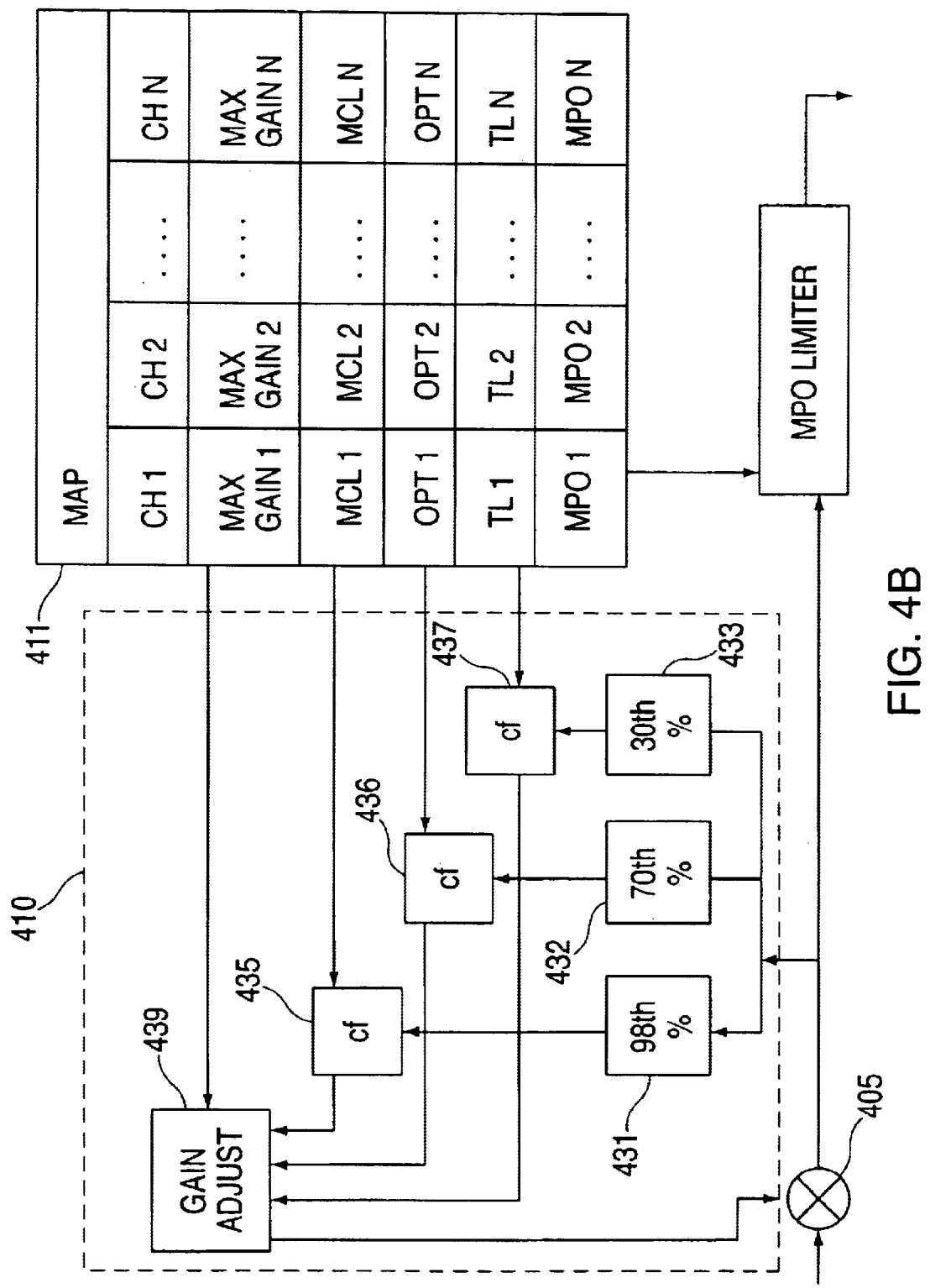
FIG. 4B schematically depicts, with greater detail, a portion of the apparatus depicted in FIG. 4A.

The signal processing operation of the first gain computation element of magnitude adjustment stage 409 will now be explained in greater detail with reference to FIG. 4b which illustrates the internal configuration of first gain computation element 410. The other gain computation elements are similarly arranged. It will be seen that the signal emanating from the adjustment element 405 is monitored by three percentile estimators 431–433. The percentile estimators each generate a ceiling value signal which indicates the level that the signal being monitored falls beneath for a particular percentage of the monitoring period. In the present embodiment the percentile estimators 431–433 are set to produce estimates of the ceiling values reached by the monitored signal 98% of the time, 70% of the time and 30% of the time respectively. As can be seen from FIGS. 1–3, when the monitored signal is derived from speech, the value that the signal falls beneath 98% of the time is much greater than the value that it falls beneath 30% of the time. The design of percentile estimator hardware is explained in U.S. Pat. No. 4,204,260 incorporated herein by reference.

The percentile level estimate signals generated by percentile estimators 431–433 are passed to comparators 435–437. Comparator 435 compares the 98th percentile estimate with the maximum comfortable level in respect of channel 1 which is stored in map 411. Similarly comparators 436 and 437 compare the 70th and 30th percentile estimates with the predetermined optimum audibility and threshold levels stored in map 411. The outcomes of the comparisons are conveyed to gain adjust unit 439. The gain adjust unit 439 is typically implemented as a programmable logic array that would control the gain of the amplifier 405 according to the following logic. In the event that the 98th percentile estimate exceeds the maximum comfortable level, then the gain should reduce slowly. Otherwise, if the 70th percentile estimate is below the optimum audibility level, the gain should increase slowly until the gain is equal to the corresponding MAXGAIN level stored in Map 411 or the 98th percentile estimate reaches the maximum comfortable level. Otherwise, if the 30th percentile estimate is above the threshold level, then the gain should fall slowly. The rates of rise and fall of the gain control unit 405 are typically 3 to 10 dB per second. The level of gain to be applied is transmitted from gain adjust section 439 to gain adjustment element 405 and the magnitude of the signal is adjusted accordingly.

While the above description explains a dedicated hardware implementation of the invention, as previously explained it will be most convenient to implement the invention by means of an appropriately programmed digital signal processor integrated circuit as illustrated in FIG. 4.

Figure 5:
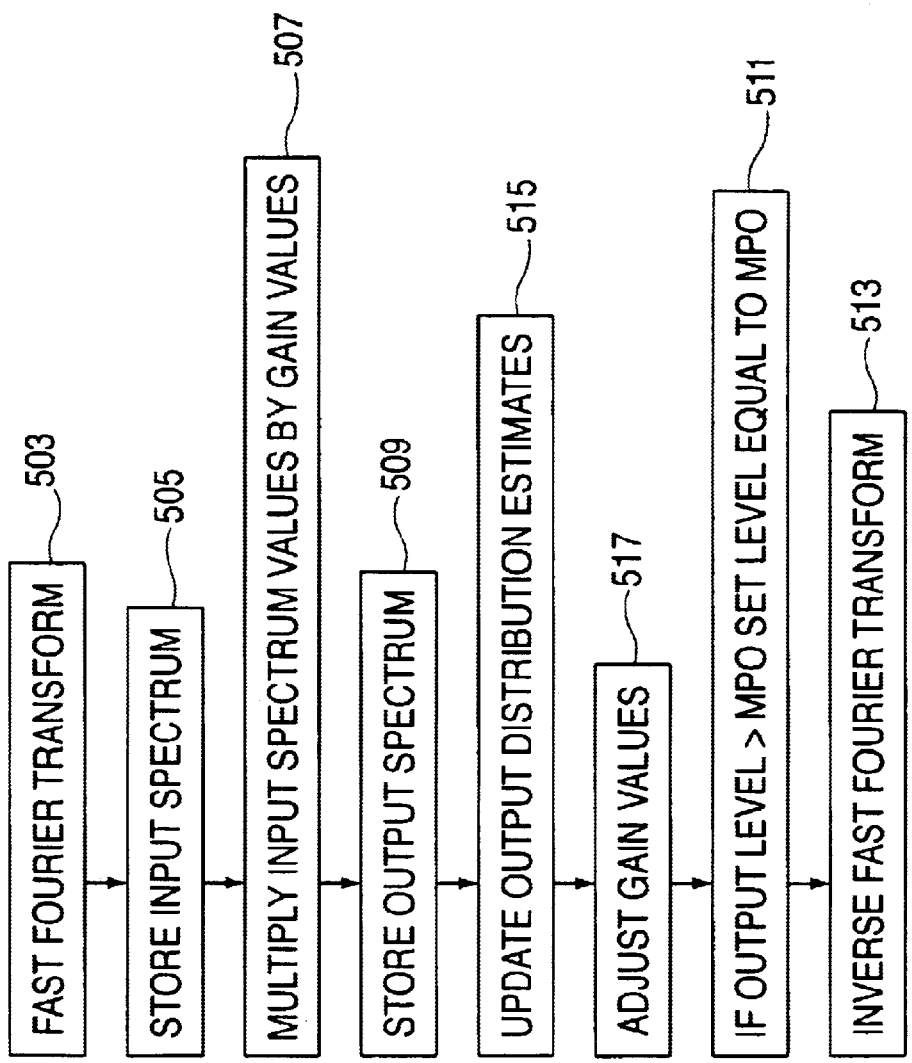
FIG. 5 is a block diagram of the method of operation of the hearing aid of FIG. 4.

Referring now to FIG. 5 a block diagram of the procedural steps followed by the program stored in EPROM 19 of FIG. 4 is presented.

At box 503 microprocessor 17 performs a fast Fourier transform upon the digital signal output of ADC 15. The fast Fourier transform produces an input spectrum consisting of N magnitude and N phase components which are stored in volatile memory, at box 505. Typically, N would take the value of 64 or 128. At box 507 each of the N magnitude components is multiplied by a corresponding one of N gain values. The results of the multiplications undertaken at box 507 are stored in volatile memory at box 509.

At box 515 each one of the N 30th, 70th and 98th percentiles of the distributions over time of the magnitudes of the frequency components is compared to the corresponding one of the N magnitude estimates of the output spectrum. The estimates are adjusted on the basis of the comparisons as will be explained with reference to FIG. 6.

At box 517 the percentile estimates are compared with values characteristic of a particular hearing response and on the basis of the comparisons the gain values at each frequency, are adjusted as will be later described in reference to FIG. 7.

At box 511 the magnitude of each of the N frequency components is compared to a predetermined maximum power output level (MPO) for that particular frequency component. If the magnitude of a frequency component is found to be greater than the MPO at the given frequency then it is set equal to the MPO level. This operation is designed to prevent fast transient signals of a certain frequency from rising above the LDL at that frequency without affecting signals at other frequencies. The MPO values are set during fitting of the ADRO hearing aid to suit the individual listener's hearing response. The MPO values used do not have to be the same as the LDL values, which are also predetermined during fitting, although they will usually be similar in value.

At box 513 an inverse fast Fourier transform is performed on the N magnitude and N phase components in order to reconstitute a digital time domain signal for subsequent processing by digital to analog converter 21.

Figure 6:
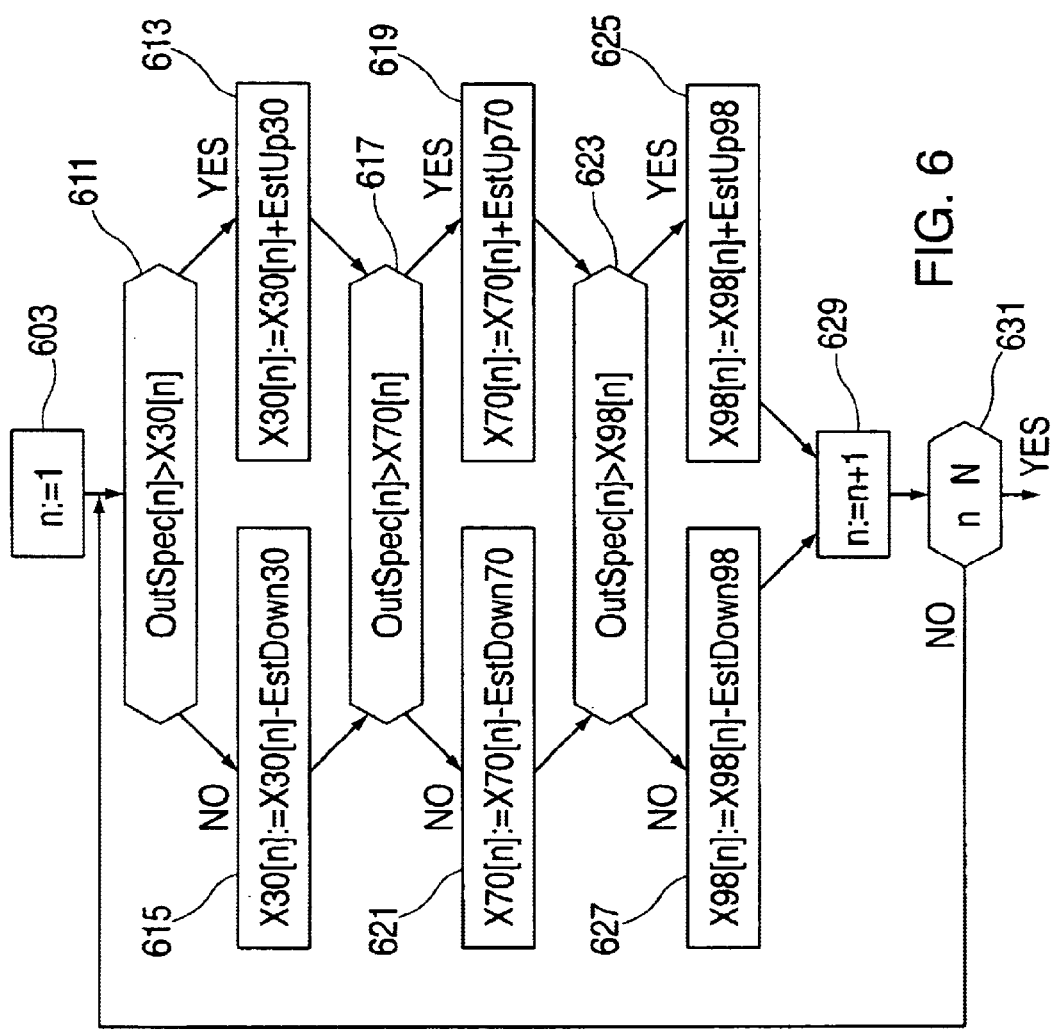
FIG. 6 is a detailed block diagram of the procedure followed at box 515 of FIG. 5

Referring now to FIG. 6 there is depicted in detail a flowchart of the procedural steps required to implement box 515 of FIG. 5.

Figure 7:
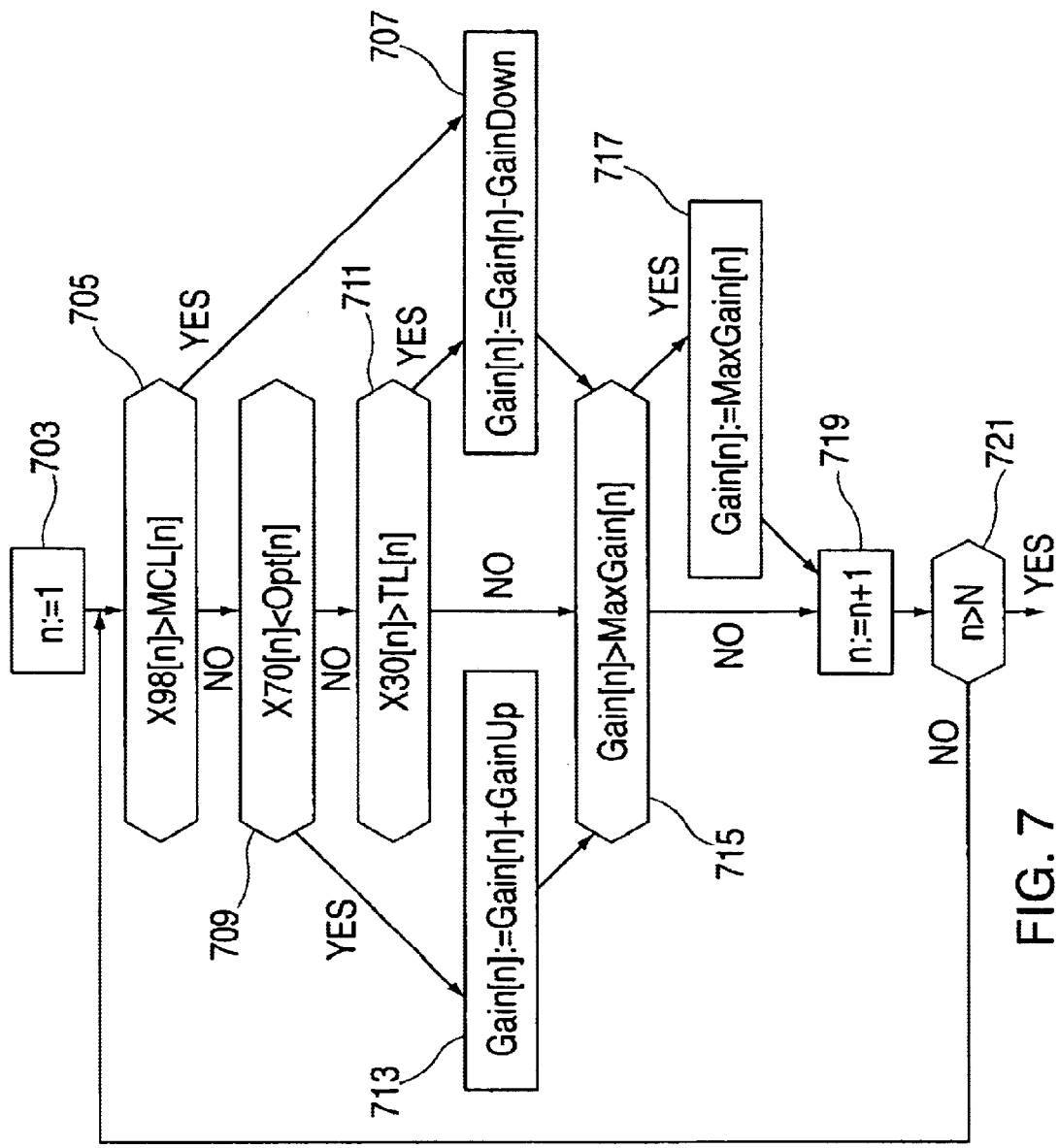
FIG. 7 is a detailed block diagram of the procedure followed at box 517 of FIG. 5.

Before explaining the procedural steps in the flowchart the following variables, which appear in FIG. 6 and FIG. 7 will be defined TL[ ]: a one dimensional array for holding N threshold level values.

MCL[ ]: a one dimensional array for holding N maximum comfortable levels. The MCL would usually be set just below the LDL at each frequency.

Opt[ ]: a one dimensional array for holding N optimal audible levels. Opt[n] would typically be set halfway between TL[n] and MCL[n] at each frequency.

X30[ ]: a one dimensional array for representing the estimate of the 30th percentiles of the amplitude distributions of each of the N different frequency components.

X70[ ]: a one dimensional array for holding the estimates of the 70th percentiles of the amplitude distributions of each of the N frequency components.

X98[ ]: a one dimensional array for holding the estimates of the 98th percentiles of the amplitude distributions of each of the N frequency components.

Gain[ ]: a one dimensional array for holding the N gain values, one for each of the N frequency components.

GainUp: a variable for holding the magnitude of the step by which a value stored in Gain[ ] is to be increased.

GainDown: a variable for holding the magnitude of the step by which a value stored in Gain[ ] is to be decreased.

n: a counter variable for indexing a particular one of the N frequency components.

EstUp30: a variable for holding the magnitude of the step by which a X30[ ] value is to be increased.

EstDown30: a variable for holding the magnitude of the step by which a X30[ ] value is to be decreased.

EstUp70, EstDown70, EstUp98, EstDown98: corresponding variables for the 70th and 98th percentile estimates.

OutSpec[ ]: a one dimensional array holding the magnitudes of the N frequency components of the output spectrum of box 509 of FIG. 5.

Returning now to FIG. 6 at box 603 counter n is set to 1. At box 611, the magnitude of the output spectrum at frequency n is compared with the estimate of the 30th percentile of the amplitude distribution at frequency n. If the magnitude is greater than or equal to the estimated 30th percentile, the estimate is increased by an amount EstUp30 at box 613, otherwise the estimate is decreased by an amount EstDown30 at box 615. The ratio of the step sizes EstUp to EstDown is equal to i/(100−i) where i is the required percentile. Thus for the 98th percentile (i.e. i=98), the EstUp step is 49 times the EstDown step.

For the 70th percentile (when i=70) the EstUp and EstDown steps in the ratio of 7:3. For the 30th percentile (when i=30) the EstUp and Est Down steps are in the ratio of 3:7. After repeated iterations through the process of FIG. 5, the estimates of the percentiles will stabilise at appropriate values.

For example, at the 98th percentile, large upward steps which occur 2% of the time will be balanced by downward steps that are 49 times smaller but occur 49 times more frequently. By varying the TotalStepSize (which is equal to EstUp+EstDown) the maximum adaptation rate of the estimates can be controlled. Boxes 617 to 627 are used to estimate the 70th and 98th percentiles of the amplitude distribution in a manner analogous to the 30th percentile. The frequency counter is incremented at box 629. Box 631 transfers control back to the main process when the percentile estimates for each frequency have been updated.

Next referring to FIG. 7, the steps in adjusting the gain for each frequency are described. As in FIG. 6, variable n is used to step through the frequencies one at a time. If the 98th percentile estimate is greater than the maximum comfortable level at the given frequency, then the gain at the given frequency is reduced by one GainDown step at box 707. At box 709 the 70th percentile estimate of the current frequency components is compared with the optimum audibility level of the frequency components. If the 70th percentile is below the Opt value for the current frequency component, then the Gain at the given frequency is increased by one GainUp step at box 713. Alternatively if the tests at both box 705 and 709 are negative then control diverts to decision box 711. If the 30th percentile estimate exceeds the optimum audibility level value then control flows to box 707 where the gain at the frequency is reduced by one GainDown step. Box 715 tests the gain value for the current frequency component to see if it is so high that feedback is likely to occur. If the result of the test at box 715 is positive then the gain value for the current frequency is set to the highest value that does not cause feedback to occur at box 717. Control then flows to box 719 at which the frequency counter n is incremented and then to box 721 at which point the entire process is repeated with respect to the next frequency component.

It will be noted that the above procedure adjusts the gain values independently of the actual values of the input spectrum. As a result microphone 11 could be replaced with another microphone of arbitrary frequency response, an induction loop, an RF microphone or a direct connection to a telephone, or other electronic device, without requiring readjustment of the aid's operating parameters relating to the listener's hearing such as the LDL and threshold levels.

Furthermore, it will be understood that the invention acts to reduce the dynamic range of the components of the output spectrum relative to those of the input spectrum. For example, input acoustic signals may typically vary over a range of 100 dB in which case 19 bit arithmetic would be required to digitally implement percentile estimators responsive to the input spectrum. In contrast, the output signal for severely-hearing impaired users will only vary over about 50 dB so that advantageously only 10 bit arithmetic is required to implement percentile estimators in the arrangement of the present invention.

One parameter that must generally be adjusted in the event that the microphone is exchanged is the set of values stored in the MaxGain[ ] array. The reason for this is that the gain depends on the difference between the input and output signals and not simply on the output signal. Feedback problems are unlikely to occur where the input microphone is acoustically well isolated from the output as is the case for an induction loop or telephone coil.

While the above system has been described with respect to a limited number of embodiments it will be realised that variations are possible. For example the output spectrum, digital output signal or corresponding analog output, generated during the various stages of processing could be passed directly to a cochlear implant processor, or digital sound processor, in which case the present invention would operate as the front-end of a further signal processor. The invention might also be applied to ear muffs or hearing protectors in order to help people with normal hearing communicate in the presence of loud background noises such as hums, whistles and some types of static. Such noises are said to be stationary and have a narrow dynamic range so that their Low, Mid and High percentiles are close together. The Low percentile is constrained to lie below the threshold according to the above described embodiment of the invention. Accordingly, the background noise is reduced to a low level. If the background noise is also characterised by having a narrow frequency range, such as a whistle, then a device according to the invention can be set to remove the noise from the output signal, while keeping most of the other (dynamic) spectral details unaffected.

Telephone and radio communication systems also have requirements for audibility and maximum output levels that can be expressed similarly to the needs of hearing aid users. The present invention can be used to ensure that these requirements are met by an appropriate choice of the processing parameters. In these cases the threshold and LDL parameters would be determined for normal listeners and would not need to be adjusted on an individual basis. The invention can also be used to optimise signals prior to further analysis by, for example, an automatic speech recognition system.

Accordingly the following claims are to be constructed broadly and are not intended to be limited to the previously described preferred embodiment.

What is claimed is:

1. An apparatus for processing an ambient sound signal including:
   a) a frequency analysis means arranged to generate a plurality of analysis signals corresponding to said ambient signal;
   b) a magnitude adjustment means coupled to the frequency analysis means and arranged to adjust the magnitude of each of said analysis signals to produce a plurality of magnitude adjusted analysis signals;
   c) a distribution estimation means responsive to said plurality of magnitude adjusted analysis signals and arranged to generate distribution values characteristic of the amplitude distribution of each of the said plurality of magnitude adjusted analysis signals over a period of time; and
   d) a comparison means coupled to the distribution estimation means and arranged to perform comparisons of said distribution values with predetermined hearing response parameters, said comparison means controlling said magnitude adjustment means on the basis of said comparisons.

2. An apparatus according to claim 1, wherein the magnitude adjustment means, the distribution estimation means and the comparison means are implemented by a programmed microprocessor coupled to memory storage means.

3. An apparatus according to claim 1, incorporated as the front-end of a further signal processor.

4. An apparatus according to claim 1, further including a signal conversion means by which the output spectrum is converted to a sound signal for presentation to a human listener.

5. An apparatus according to claim 2, wherein the hearing response parameters are stored in said memory and include maximum comfortable levels, optimum audibility levels and threshold levels for each of the plurality of frequency components.

6. An apparatus according to claim 2, wherein the microprocessor is programmed to calculate and store in memory, distribution values indicative of the distribution of the magnitude of each of said plurality of adjusted frequency components over a period of time.

7. An apparatus according to claim 6, wherein the microprocessor is programmed to determine and store in memory, distribution values which are approximately the 30th, 70th and 98th percentiles of the magnitude of each of said plurality of adjusted frequency components over a period of time.

8. An apparatus according to claim 1, further including a plurality of limiting means responsive to said magnitude adjusted analysis signals and arranged to limit the power of each of said signals to below a corresponding plurality of predetermined levels.

9. A method for processing an ambient sound signal including the steps of:
   a) performing a frequency analysis on the ambient sound signal to generate a plurality of analysis signals corresponding to the ambient sound signal;
   b) multiplying each of said plurality of analysis signals by a corresponding one of a plurality of gain values to produce a plurality of magnitude adjusted analysis signals;
   c) determining distribution values characteristic of the amplitude distribution of each of the plurality of magnitude adjusted analysis signals over a period of time;
   d) setting said gain values on the basis of comparisons between said distribution values and a plurality of hearing response parameters.

10. A method according to claim 9, wherein the plurality of hearing response parameters includes maximum comfortable levels, optimum audibility levels and threshold levels.

11. A method according to claim 9, wherein the distribution values comprise statistical values representing the distribution of the magnitude of each of said plurality of magnitude adjusted analysis signals over a period of time.

12. A method according to claim 11, wherein the distribution values include ith percentile values of the distribution of the magnitude of each of said plurality of magnitude adjusted analysis signals over a period of time.

13. A method according to claim 12, wherein the distribution values determined are ith percentile values being approximately the 30th, 70th and 98th percentiles.

14. A method according to claim 13, wherein in step c) the determining of said distribution values includes the step of comparing the magnitude of a magnitude adjusted analysis signal with a distribution value being one of said ith percentile values, said distribution value being reduced by a first step size or increased by a second step size depending on the outcome of said comparison.

15. A method according to claim 14, wherein the ratio of the first step size to the second step size is equal to i/(100−i).

16. A method according to claim 9 further including the step of:
   e) ensuring that each of the plurality of magnitude adjusted analysis signals is less than a corresponding predetermined maximum power output level.

17. A method according to claim 9 wherein said frequency analysis comprises the application of a Fourier transform to said ambient signal.

18. A method according to claim 17 further including the steps of performing an inverse fast fourier transform upon the plurality of adjusted frequency components to produce a digital time domain signal; and converting said digital time domain signal to an analogue signal.

19. A multi-channel hearing aid including the apparatus according to claim 1 and having a plurality of channels, said hearing aid including a plurality of hard limiters each coupled to a corresponding one of said plurality of channels, each said limiter arranged to prevent signals in said corresponding channel exceeding a corresponding predetermined level.

20. A multi-channel hearing aid according to claim 19, wherein each of said hard limiters are arranged to act within 0.1 millisecond.

21. A multi-channel hearing aid employing the method according to claim 9 wherein the hearing aid includes a plurality of channels, said hearing aid including a plurality of hard limiters each coupled to a corresponding one of said plurality of channels, each said limiter arranged to prevent signals in said corresponding channel exceeding a corresponding predetermined level.

* * * * *